(12) United States Patent
Itoh

(10) Patent No.: US 7,989,935 B2
(45) Date of Patent: Aug. 2, 2011

(54) SEMICONDUCTOR DEVICE

(75) Inventor: Kohzoh Itoh, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 470 days.

(21) Appl. No.: 11/791,683

(22) PCT Filed: Sep. 11, 2006

(86) PCT No.: PCT/JP2006/018434
§ 371 (c)(1),
(2), (4) Date: May 25, 2007

(87) PCT Pub. No.: WO2007/037142
PCT Pub. Date: Apr. 5, 2007

(65) Prior Publication Data
US 2008/0029846 A1    Feb. 7, 2008

(30) Foreign Application Priority Data
Sep. 27, 2005 (JP) .................. 2005-280226

(51) Int. Cl.
*H01L 23/02* (2006.01)

(52) U.S. Cl. ........ 257/678; 257/691; 257/700; 257/723; 257/724; 257/E23.044; 257/E23.071

(58) Field of Classification Search .................. 257/678, 257/679, 685, 723, 724, E23.044, E23.057, 257/E23.071
See application file for complete search history.

(56) References Cited

U.S. PATENT DOCUMENTS

| | | | | |
|---|---|---|---|---|
| 6,703,697 | B2 * | 3/2004 | Leahy et al. | 257/678 |
| 2004/0238937 | A1 * | 12/2004 | Kimura et al. | 257/690 |
| 2005/0248391 | A1 | 11/2005 | Itoh | |
| 2006/0113632 | A1 | 6/2006 | Kimura et al. | |

FOREIGN PATENT DOCUMENTS

| | | |
|---|---|---|
| JP | 10-20946 | 1/1998 |
| JP | 2001-274332 | 10/2001 |
| JP | 2002-163024 | 6/2002 |
| JP | 2002-343927 | 11/2002 |
| JP | 2003-58260 | 2/2003 |
| JP | 2003-86683 | 3/2003 |
| WO | WO03/023851 A1 | 3/2003 |
| WO | WO2005/022283 A1 | 3/2005 |

* cited by examiner

*Primary Examiner* — Minh-Loan T Tran
*Assistant Examiner* — Leslie Pilar Cruz
(74) *Attorney, Agent, or Firm* — Cooper & Dunham LLP

(57) ABSTRACT

A semiconductor device having a voltage regulator is disclosed that does not have an external output condenser for phase compensation. The semiconductor device includes a semiconductor chip that includes a voltage regulator, a power supply input terminal, a ground terminal, and an output terminal for outputting a produced constant voltage; and a phase compensation condenser that is connected between the output terminal and the ground terminal for phase compensation of the voltage regulator. The semiconductor chip and the phase compensation condenser are accommodated in a single package.

10 Claims, 6 Drawing Sheets

SEMICONDUCTOR DEVICE

TECHNICAL FIELD

The present invention relates to a semiconductor device in which an IC chip having a voltage regulator is installed in a chip-size package (CSP: Chip Size Package), and particularly, to a semiconductor device having a voltage regulator with a condenser connected between an output terminal and a grounding terminal of the voltage regulator for phase compensation.

BACKGROUND ART

In the related art, in an IC chip including a voltage regulator, an output condenser is connected to an output terminal of the voltage regulator parallel to a load. Generally, an electrolytic condenser or a tantalum condenser is used as the output condenser, but recently, a stacked ceramic condenser, which is compact and able to have a large capacity, has been developed and put into practical use.

The electrolytic condenser, the tantalum condenser, and the stacked ceramic condenser have different equivalent series resistances (abbreviated to be "ESR" where necessary). For example, the equivalent series resistance of the electrolytic condenser is 0.1-100Ω, the equivalent series resistance of the tantalum condenser is 0.01-10Ω, and the equivalent series resistance of the ceramic condenser is 0.001-0.1Ω. Due to the different equivalent series resistances of condensers connected to the output terminal, sometimes phase compensation of the voltage regulator cannot be performed appropriately depending on types of the condensers.

Generally, the phase compensation of the voltage regulator is also carried out in the circuits of the voltage regulator; when the output condenser is combined with the voltage regulator, a zero-point appears in the frequency characteristic curve, and consequently, a phase margin appears in a region where the frequency gain is near 0 dB. When the ceramic condenser, which has a small equivalent series resistance, is connected to the voltage regulator, however, the above-mentioned zero-point in the frequency characteristic curve moves to the high frequency side, the phase margin disappears in the region where the frequency gain is near 0 dB, and this causes oscillation. To solve this problem, when a ceramic condenser is used as the output condenser, a resistor of a resistance from 0.001 mΩ to 1.5Ω is connected to the ceramic condenser in series to cover the lack of the equivalent series resistance.

For example, Japanese Laid Open Patent Application No. 2003-86683 discloses a technique in this field.

FIG. 11 is a circuit diagram illustrating an example of a semiconductor device of the related art, in which an IC chip having a voltage regulator is installed in a chip-size package (CSP).

The semiconductor device shown in FIG. 11 includes a CSP 101, a load 102, a direct-current power supply 103 serving as an input power supply, a semiconductor chip 110 having a voltage regulator, and a ceramic condenser C121.

The equivalent series resistance of the ceramic condenser C121 is represented by Resr, and the capacitance of the ceramic condenser C121 is represented by Co.

A resistor R113 in the CSP 101 is for compensating for the equivalent series resistance of the ceramic condenser C121. The resistor R113 is formed by employing the wiring resistance of the rerouting wires disposed in an interposer of the CSP 101, and is formed between an output terminal 113 of the semiconductor chip 110 having the voltage regulator, and an output terminal OUT of the CSP 101.

Since the resistor R113 is formed in the CSP 101, even when the output condenser C121 is a ceramic condenser, the phase compensation of the voltage regulator can be carried out appropriately, and oscillation can be prevented even without the load 102 being connected to the output condenser C121 in series.

However, since the resistor R113 is formed between the output terminal 113 of the semiconductor chip 110 and the output terminal OUT of the CSP 101, when an output current through the load 102 becomes large, the voltage drop across the resistor R113 increases and cannot be neglected any longer. For this reason, the resistance of the resistor R113 has to be relatively small, for example, the resistance of the resistor R113 is in a range from 10 mΩ to 200 mΩ. Because of such an output condenser C121, the phase margin may become small, and furthermore, in applications involving large currents, the voltage drop across the resistor R113 having such a small resistance value can still become too large to be neglected.

In addition, since the output condenser C121 is present as an external part, the mounting area cannot be reduced very much, furthermore, from the point of view of fabrication and management, work load of inventory control and mounting of the output condenser C121 are required, and from the point of view of stability of the output voltage, a user has to consider matching the output condenser C121 and the voltage regulator. Due to this, quality and ease of use of the device cannot be improved sufficiently.

SUMMARY DISCLOSURE OF THE INVENTION

A semiconductor device, according to a preferred embodiment of this disclosure, has a voltage regulator without an external output condenser for phase compensation.

According to a first aspect of the disclosure, there is provided a semiconductor device, comprising:

a semiconductor chip that includes a voltage regulator and has a power supply input terminal, a ground terminal, and an output terminal for outputting a produced constant voltage; and a phase compensation condenser that is connected between the output terminal and the ground terminal for phase compensation of the voltage regulator, wherein the semiconductor chip and the phase compensation condenser are accommodated in a single package.

According to a second aspect of this disclosure, there is provided a semiconductor device, comprising:

a semiconductor chip that includes a voltage regulator and has a power supply input terminal, a ground terminal, and an output terminal for outputting a produced constant voltage; and a serial circuit that is connected between the output terminal and the ground terminal and includes a phase compensation condenser for phase compensation of the voltage regulator and a phase compensation resistor for adjusting a resistance value of an equivalent serial resistance of the phase compensation condenser, wherein the semiconductor chip and the serial circuit are accommodated in a single package.

According to a third aspect of this disclosure, there is provided a semiconductor device, comprising:

a semiconductor chip that includes a voltage regulator and has a power supply input terminal, a ground terminal, an output terminal for outputting a produced constant voltage, and a connection terminal; and a phase compensation condenser that is connected between the connection terminal and the ground terminal for phase compensation of the voltage regulator, wherein the semiconductor chip and the phase compensation condenser are accommodated in a single package, and the semiconductor chip includes a phase compensation resistor that is connected between the connection terminal and the output terminal of the voltage regulator for adjusting a resistance value of an equivalent serial resistance of the phase compensation condenser.

According to a fourth aspect of this disclosure, there is provided a semiconductor device, comprising:

a semiconductor chip that includes a voltage regulator and has a power supply input terminal, a ground terminal, an output terminal for outputting a produced constant voltage, and a connection terminal connected to the output terminal in parallel; and a serial circuit that is connected between the connection terminal and the ground terminal and includes a phase compensation condenser for phase compensation of the voltage regulator and a phase compensation resistor for adjusting a resistance value of an equivalent serial resistance of the phase compensation condenser, wherein the semiconductor chip and the serial circuit are accommodated in a single package.

As an embodiment, the phase compensation condenser is connected to the semiconductor chip by using a rerouting wire of an interposer.

As an embodiment, the phase compensation resistor is formed from a wiring resistance of a rerouting wire of an interposer.

As an embodiment, the phase compensation resistor is formed from a resistive bonding wire for connection with the connection terminal of the semiconductor chip.

As an embodiment, the phase compensation condenser has a length less than or equal to 1 mm and a width less than or equal to 0.5 mm.

As an embodiment, the phase compensation resistor has a length less than or equal to 1 mm and a width less than or equal to 0.5 mm.

As an embodiment, the phase compensation condenser is a ceramic condenser.

As an embodiment, the phase compensation condenser has an equivalent serial resistance from 10 m$\Omega$ to 500 m$\Omega$.

As an embodiment, the phase compensation resistor has a resistance from 10 m$\Omega$ to 1.5$\Omega$.

In the above-mentioned semiconductor devices, since the semiconductor chip having a voltage regulator and a phase compensation condenser for phase compensation of the voltage regulator, or a phase compensation resistor connected to the phase compensation condenser in series, can be accommodated in a single package, such as a CSP, an external part and mounting step can be omitted; further, inventory control of the phase compensation condenser can be omitted on the side of users. In addition, since it is possible to perform inspection and quality assurance with the condenser being mounted, it is possible to improve operational stability and quality, and obtain an easy-to-use voltage regulator.

In addition, since an output current does not flow through the phase compensation resistor, voltage loss across the phase compensation resistor is small, and load characteristics can be improved. Further, since the resistance value of the phase compensation resistor, which is for compensating for ESR, can be adjusted in a wide range, it is possible to increase the phase margin of the voltage regulator, and obtain a highly stable voltage regulator.

In addition, since the phase compensation resistor is formed from a wiring resistance of a rerouting wire of an interposer, or a resistive bonding wire, it is possible to omit a chip resistor, and this reduces the size and cost of the device.

In addition, since a so-called 1005 type small part which has a length less than or equal to 1 mm and a width less than or equal to 0.5 mm, or even smaller parts than the 1005 type parts are used as the phase compensation condenser and the phase compensation resistor, which are passive parts, it is possible to prevent an increase of the package size compared to the related art, in which the semiconductor and the passive parts are mounted separately.

In addition, since a ceramic condenser is used as the phase compensation condenser, the phase compensation condenser can be made small while having a large capacity.

In addition, since the phase compensation condenser may have an equivalent resistance from 10 m$\Omega$ to 500 m$\Omega$, it is possible to perform phase compensation of the voltage regulator easily, and obtain a voltage regulator of high stability and quality by inspection of condenser performance and quality assurance.

In addition, since the phase compensation resistor may have a resistance from 10 m$\Omega$ to 1.5$\Omega$, it is possible to perform phase compensation of the voltage regulator easily, and obtain a voltage regulator of high stability.

These and other aspects, features, and advantages will become more apparent from the following detailed description of preferred embodiments given with reference to the accompanying drawings.

BEST MODE FOR CARRYING OUT THE INVENTION

Below, preferred embodiments of the present invention are explained with reference to the accompanying drawings.

First Embodiment

Figure 1:
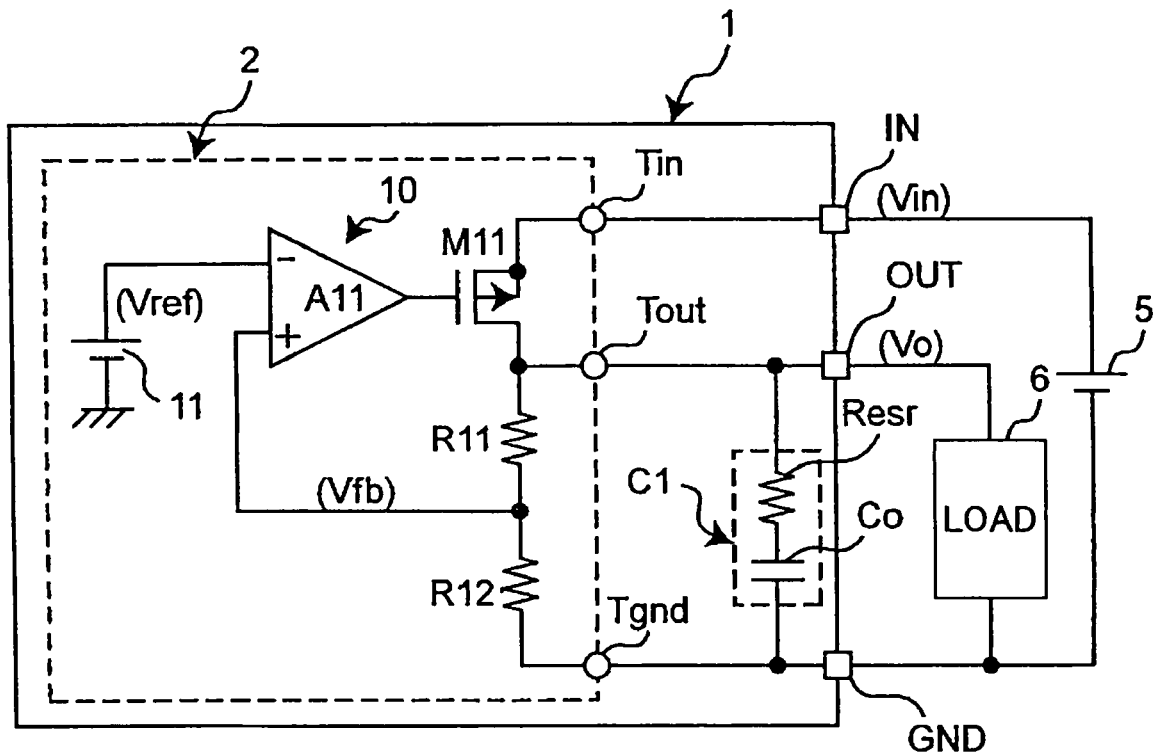
FIG. 1 is a circuit diagram illustrating an example of a semiconductor device according to a first embodiment of the present invention.

FIG. 1 is a circuit diagram illustrating an example of a semiconductor device according to a first embodiment of the present invention.

In a semiconductor device 1 shown in FIG. 1, a semiconductor chip 2 having a voltage regulator 10, and an output condenser C1 are installed in a chip-size package (CSP). The semiconductor device 1 further includes a power supply input terminal IN, an output terminal OUT, and a ground terminal GND connected to ground potential. An input voltage Vin from a direct current power supply 5 is input to the power supply input terminal IN. The output condenser C1 serves as the phase compensation condenser of the voltage regulator 10. An output voltage Vo from the voltage regulator 10 is supplied to a load 6 through the output terminal OUT.

The voltage regulator 10 constitutes a series regulator, which transforms the input voltage Vin supplied to the power supply input terminal IN to a specified constant voltage, and outputs the output voltage Vo through the output terminal OUT.

The voltage regulator 10 includes a reference voltage generation circuit 11 for generating and outputting a reference voltage Vref; output voltage detection resistors R11 and R12 which divide the output voltage Vo, and generate and output a divisional voltage Vfb; an output transistor M11 which includes a PMOS transistor for controlling the current output to the output terminal OUT in response to signals input to a gate; and an error amplification circuit A11 which controls operations of the output transistor M11 so that the divisional voltage Vfb becomes the reference voltage Vref.

The semiconductor chip 2 includes a power supply input terminal Tin, an output terminal Tout, and a ground terminal Tgnd. The power supply input terminal Tin is connected to the power supply input terminal IN of the CSP, the output terminal Tout is connected to the output terminal OUT of the CSP, and the ground terminal Tgnd is connected to the ground terminal GND of the CSP. The output condenser C1 is connected between the output terminal Tout and the ground terminal Tgnd. The equivalent series resistance of the output condenser C1 is represented by Resr, and the capacitance of the output condenser C1 is represented by Co. For example, a tantalum condenser, which has a large ERS, is used as the output condenser C1, and the output condenser C1 is built in the CSP package.

In the voltage regulator 10, the output transistor M11 is connected between the power supply input terminal Tin and the ground terminal Tgnd, and the resistors R11 and R12 are connected in series between the output terminal Tout and the ground terminal Tgnd. From the connection point of the resistors R11 and R12, the divisional voltage Vfb, which is obtained by dividing the output voltage Vo, is output. The divisional voltage Vfb is input to a non-inverted input terminal of the error amplification circuit A11, and the reference voltage Vref is input to an inverted input terminal of the error amplification circuit A11. An output terminal of the error amplification circuit A11 is connected to the gate of the output transistor M11.

Figure 2:
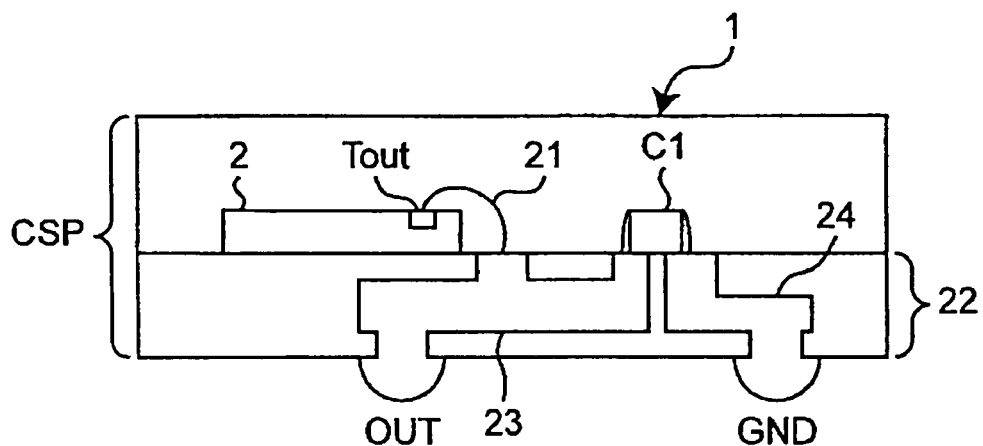
FIG. 2 is a schematic cross-sectional diagram illustrating the semiconductor device in FIG. 1.

FIG. 2 is a schematic cross-sectional diagram illustrating the semiconductor device in FIG. 1.

For example, the terminals of the semiconductor chip 2 are connected by bonding wires at bonding pads formed on an interposer of the CSP. The bonding pads are connected to corresponding connection terminals of the CSP by rerouting wires of the interposer. For example, as shown in FIG. 2, the output terminal Tout of the semiconductor chip 2 is connected to the output terminal OUT of the CSP through a bonding wire 21 and a rerouting wire 23 of the interposer 22. One terminal of the output condenser C1 is connected to the output terminal OUT of the CSP through the rerouting wire 23 of the interposer 22, and the other terminal of the output condenser C1 is connected to the ground terminal GND of the CSP through the rerouting wire 24 of the interposer 22.

As described above, in the semiconductor device of the present embodiment, the rerouting wires of the interposer 22 are used to connect the terminals of the output condenser C1 and the terminals of the CSP, and the semiconductor chip 2 and the output condenser C1 are accommodated in a single CSP package; therefore it is not necessary to mount the output condenser C1 outside the CSP, and inventory control of the output condenser C1 in the mounting step can be omitted.

Second Embodiment

Figure 3:
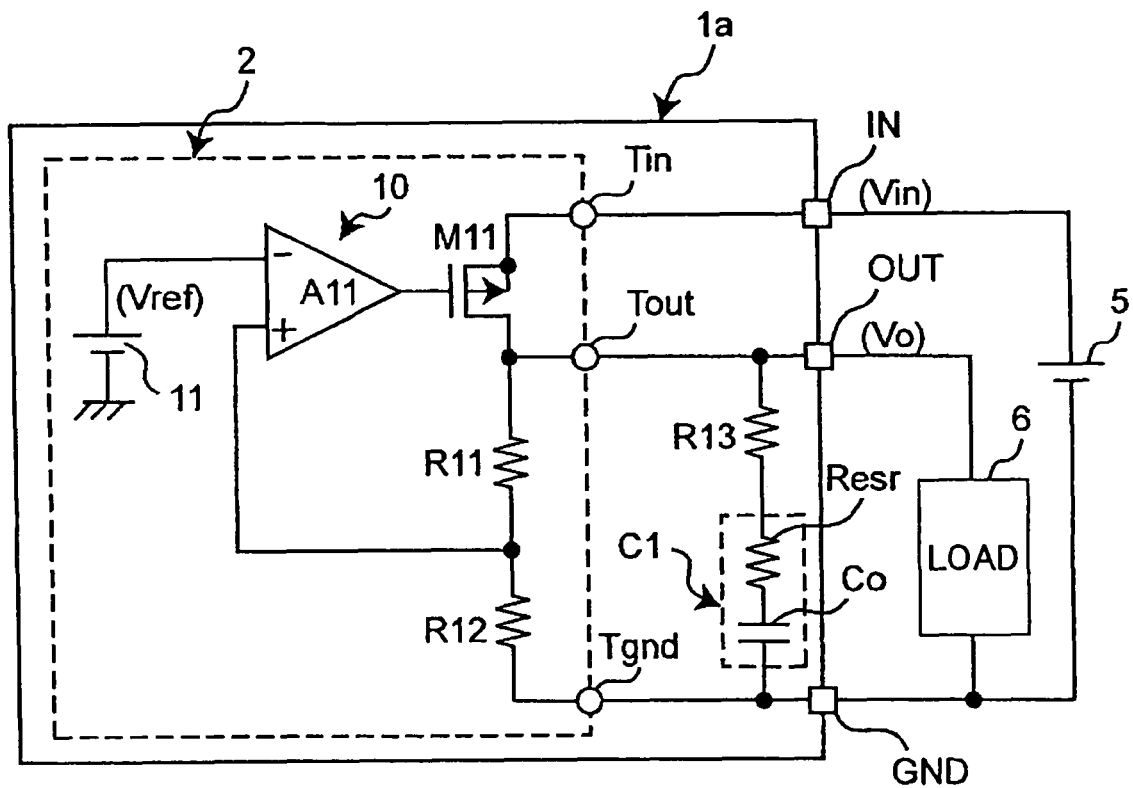
FIG. 3 is a circuit diagram illustrating an example of a semiconductor device according to a second embodiment of the present invention.

FIG. 3 is a circuit diagram illustrating an example of a semiconductor device according to a second embodiment of the present invention.

In FIG. 3, the same reference numbers are assigned to the same elements as those described previously, and overlapping descriptions are omitted.

A semiconductor device 1a in FIG. 3 differs from the semiconductor device 1 in FIG. 1 in that a resistor R13 is disposed for adjusting ESR of the output condenser C1.

In the semiconductor device 1a as shown in FIG. 3, a semiconductor chip 2, an output condenser C1, and the resistor R13 for adjusting the ESR of the output condenser C1 are installed in the chip-size package (CSP). The resistor R13 serves as the phase compensation resistor. A serial circuit of the resistor R13 and the output condenser C1 is connected between the connection point of the output terminal Tout of the semiconductor chip 2 and the output terminal OUT of the CSP, and the connection point of the ground terminal Tgnd of the semiconductor chip 2 and the ground terminal GND of the CSP.

With such a configuration, a condenser of a small ESR can be used as the output condenser C1; for example, the ESR is in a range from 10 mΩ to 500 mΩ. Due to this, the ceramic condenser, which has a small ESR, can be used.

Figure 4:
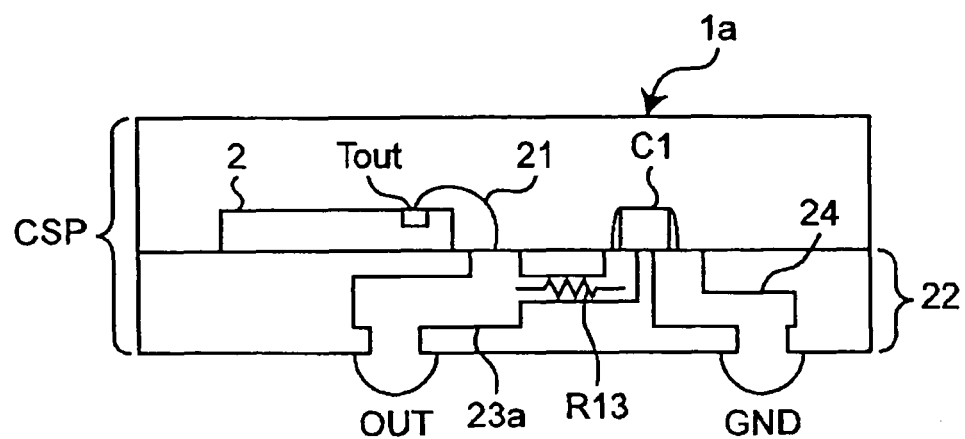
FIG. 4 is a schematic cross-sectional diagram illustrating the semiconductor device 1a in FIG. 3.

FIG. 4 is a schematic cross-sectional diagram illustrating the semiconductor device 1a in FIG. 3.

In FIG. 4, the same reference numbers are assigned to the same elements as those described previously, and overlapping descriptions are omitted.

As described above, the semiconductor device 1a in FIG. 3 differs from the semiconductor device 1 in FIG. 1 in that the resistor R13 is provided, which is formed by using the wiring resistance of a rerouting wire 23a of the interposer 22, the rerouting wire 23a connecting the output condenser C1 and the output terminal OUT.

As shown in FIG. 4, the width of a portion of the rerouting wire 23a for connecting the output condenser C1 and the output terminal OUT is reduced to form the resistor R13, which has a certain resistance.

In FIG. 4, although it is described that the resistor R13 is formed by utilizing the wiring resistance of the rerouting wire 23a, the resistor R13 may also be formed by utilizing a chip resistance, and in this case, the rerouting wiring of the interposer may be used as a wire to the chip resistance.

According to the present embodiment, the semiconductor chip 2, the output condenser C1, and the resistor R13 are accommodated in a single CSP package; it is not necessary to mount the output condenser C1 outside the CSP, and inventory control of the output condenser C1 in the mounting step can be omitted. In addition, since a condenser of a small ESR can be used as the output condenser C1, a small condenser can be used as the output condenser C1.

In the related art, if the resistance value of the resistor R13 is large, the voltage drop caused by an output current becomes large, and this causes a change of the output voltage. Hence, in the related art, the resistance value of the resistor R13 cannot be made too large. However, in the semiconductor device of the present embodiment, since the output current does not flow through the resistor R13, voltage loss across the resistor R13 is small; hence the resistor R13 can have a large resistance, and it is possible to select an optimum resistance value suitable for the output condenser C1.

If the resistance corresponding to the ESR of the output condenser C1 is represented by Resr, the capacitance of the output condenser C1 is represented by Co, and the resistance value of the resistor R13 is represented by R13, generally, the frequency resulting in a zero-point in the frequency characteristic curve is expressed by $1/\{2\pi \times Co \times (Resr+R13)\}$ Hence, by reducing the capacitance of the output condenser C1 and increasing the resistance value of the resistor R13, it is possible to produce a zero-point at the same frequency.

Therefore, since a small output condenser can be used, it is possible to reduce the size of the CSP package. When a stacked ceramic condenser is used as the output condenser C1, if a so-called 1005 type condenser, which has a length less than or equal to 1 mm and a width less than or equal to 0.5 mm, is used, the size of the CSP package essentially does not increase, but is maintained to be nearly the same as the CSP package in the related art.

Third Embodiment

In the previous embodiment, the phase compensation resistor (resistor R13) is disposed in the CSP, but the phase compensation resistor may also be disposed in the semiconductor chip.

Figure 5:
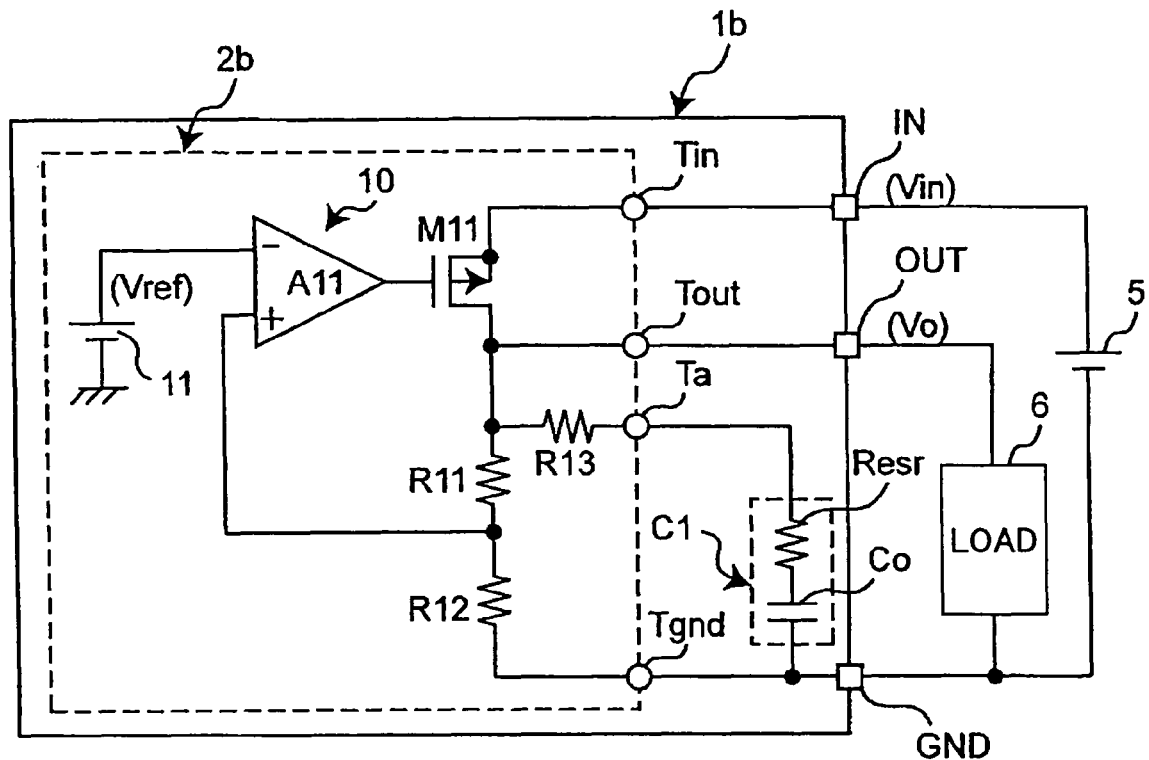
FIG. 5 is a circuit diagram illustrating an example of a semiconductor device according to a third embodiment of the present invention.

FIG. 5 is a circuit diagram illustrating an example of a semiconductor device according to a third embodiment of the present invention.

In FIG. 5, the same reference numbers are assigned to the same elements as those described previously, and overlapping descriptions are omitted.

In the present embodiment, the resistor R13 is disposed in a semiconductor chip 2a, instead of in the CSP. In addition, a connection terminal Ta is formed in the semiconductor chip 2a for connecting the output condenser C1 and the resistor R13.

In the semiconductor device 1b as shown in FIG. 5, a semiconductor chip 2b having a voltage regulator 10 and the output condenser C1 are installed in the CSP.

The semiconductor chip 2b includes the voltage regulator 10 and the resistor R13, the power supply input terminal Tin, the output terminal Tout, the ground terminal Tgnd, and the connection terminal Ta. The resistor R13 is connected between the drain of the output transistor M11 and the connection terminal Ta, and the output condenser C1 is connected between the connection terminal Ta and the ground terminal Tgnd. For example, the resistance of the resistor R13 is in a range from about 10 m$\Omega$ to about 1.5$\Omega$, and is optimized in response to the capacity and the ESR of the output condenser C1.

Figure 6:
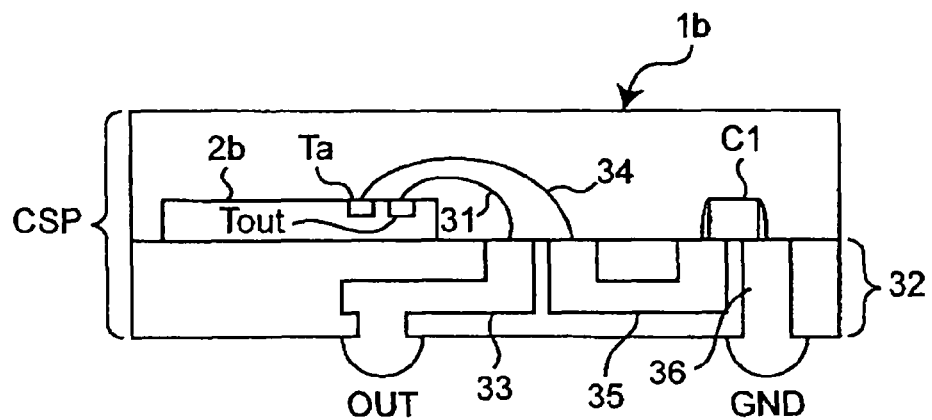
FIG. 6 is a schematic cross-sectional diagram illustrating the semiconductor device 1b in FIG. 5.

FIG. 6 is a schematic cross-sectional diagram illustrating the semiconductor device 1b in FIG. 5.

In FIG. 6, the same reference numbers are assigned to the same elements as those described previously, and overlapping descriptions are omitted.

As shown in FIG. 6, the terminals of the semiconductor chip 2b are connected by bonding wires at bonding pads formed on an interposer of the CSP. The bonding pads are connected to corresponding connection terminals of the CSP by rerouting wires of the interposer. For example, as shown in FIG. 6, the output terminal Tout of the semiconductor chip 2b is connected to the output terminal OUT of the CSP through a bonding wire 31 and a rerouting wire 33 of the interposer 32. The connection terminal Ta of the semiconductor chip 2b is connected to one terminal of the output condenser C1 through a bonding wire 34 and a rerouting wire 35 of the interposer 32. The other terminal of the output condenser C1 is connected to the ground terminal GND of the CSP through a through-hole 36. Certainly, the other terminal of the output condenser C1 may be connected to the ground terminal GND of the CSP through the rerouting wire of the interposer 32.

In the present embodiment, since the resistor R13 is disposed in the semiconductor chip 2b, the same effects as the previous embodiments can be obtained, and it is possible to further reduce the size of the CSP package.

Fourth Embodiment

Figure 7:
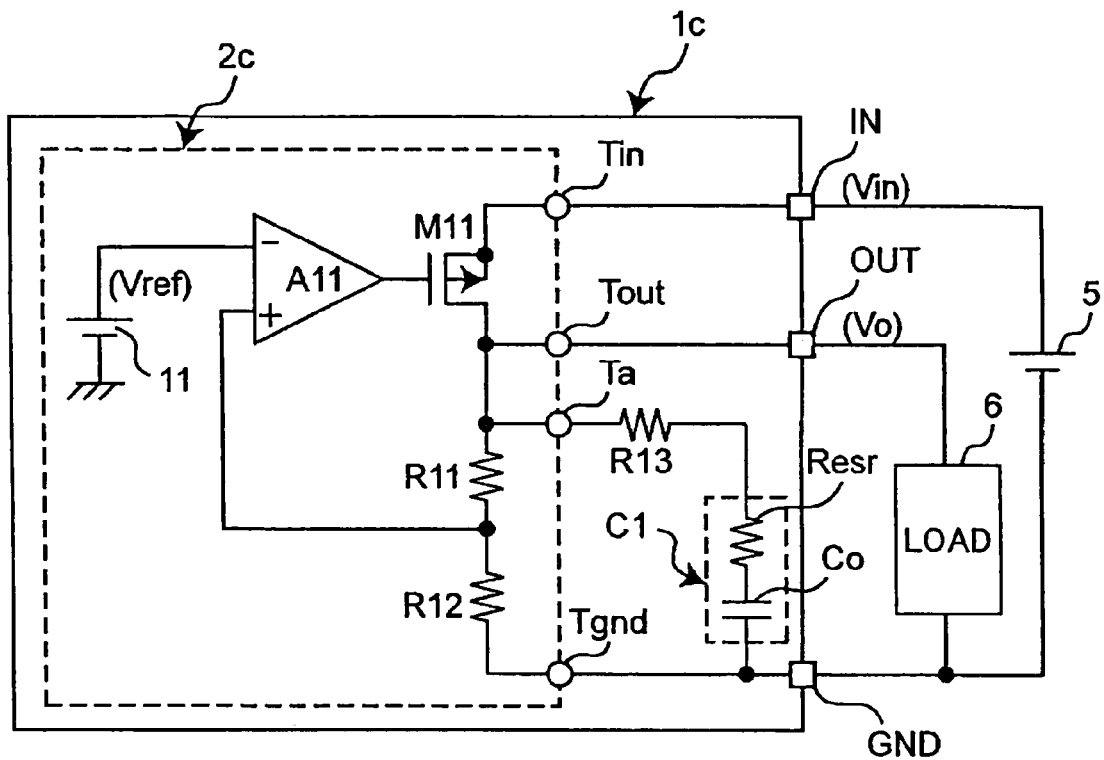
FIG. 7 is a circuit diagram illustrating an example of a semiconductor device according to a fourth embodiment of the present invention.

FIG. 7 is a circuit diagram illustrating an example of a semiconductor device according to a fourth embodiment of the present invention.

In FIG. 7, the same reference numbers are assigned to the same elements as those described previously, and overlapping descriptions are omitted.

In the present embodiment, the resistor R13 is formed from a resistive bonding wire connecting the connection terminal Ta of the semiconductor chip and the output condenser C1.

In a semiconductor device 1c as shown in FIG. 7, a semiconductor chip 2c having a voltage regulator 10, the output condenser C1, and the resistor R13 are installed in the CSP.

The semiconductor chip 2c includes the voltage regulator 10, and the power supply input terminal Tin, the output terminal Tout, the ground terminal Tgnd, and the connection terminal Ta.

The bonding wire for connecting the connection terminal Ta of the semiconductor chip 2c and the output condenser C1 is formed to possess a specified resistance, and such a bonding wire is used as the resistor R13.

For example, the resistance of the resistor R13 is in a range from about 10 m$\Omega$ to about 1.5$\Omega$, and is optimized in response to the capacity and the ESR of the output condenser C1.

Figure 8:
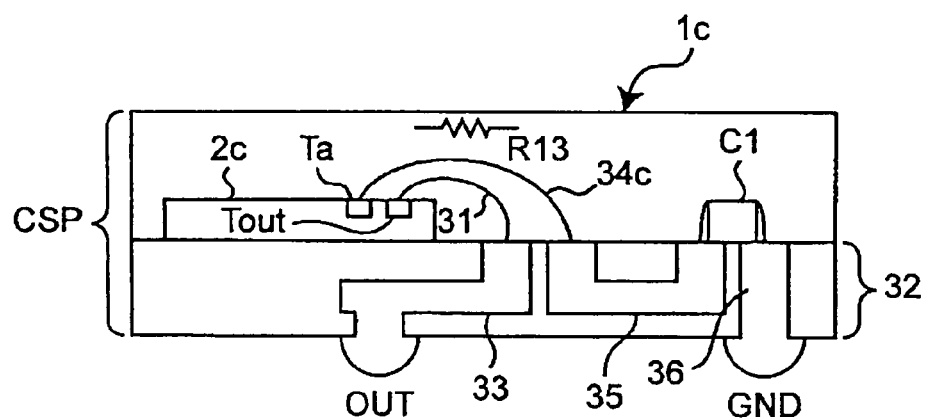
FIG. 8 is a schematic cross-sectional diagram illustrating the semiconductor device 1c in FIG. 7.

FIG. 8 is a schematic cross-sectional diagram illustrating the semiconductor device 1c in FIG. 7.

In FIG. 8, the same reference numbers are assigned to the same elements as those described previously, and overlapping descriptions are omitted.

As shown in FIG. 8, the terminals of the semiconductor chip 2c are connected by bonding wires at bonding pads formed on an interposer of the CSP. The bonding pads are connected to corresponding connection terminals of the CSP by rerouting wires of the interposer. For example, as shown in FIG. 8, the output terminal Tout of the semiconductor chip 2c is connected to the output terminal OUT of the CSP through a bonding wire 31 and a rerouting wire 33 of the interposer 32. The connection terminal Ta of the semiconductor chip 2c is connected to one terminal of the output condenser C1 through a bonding wire 34c, which serves as the resistor R13, and a rerouting wire 35 of the interposer 32. The other terminal of the output condenser C1 is connected to the ground terminal GND of the CSP through a through-hole 36. Certainly, the other terminal of the output condenser C1 may also be connected to the ground terminal GND of the CSP through the rerouting wire of the interposer 32.

In the present embodiment, since the resistor R13 is formed by the bonding wire, the same effects as the previous embodiments can be obtained, and it is possible to further reduce the size of the CSP package.

While the present invention is described with reference to specific embodiments chosen for purpose of illustration, it should be apparent that the invention is not limited to these embodiments, but numerous modifications could be made thereto by those skilled in the art without departing from the basic concept and scope of the invention.

For example, in the fourth embodiment, the resistor R13 may be formed to serve as the rerouting wire 35 of the interposer 32.

Figure 9:
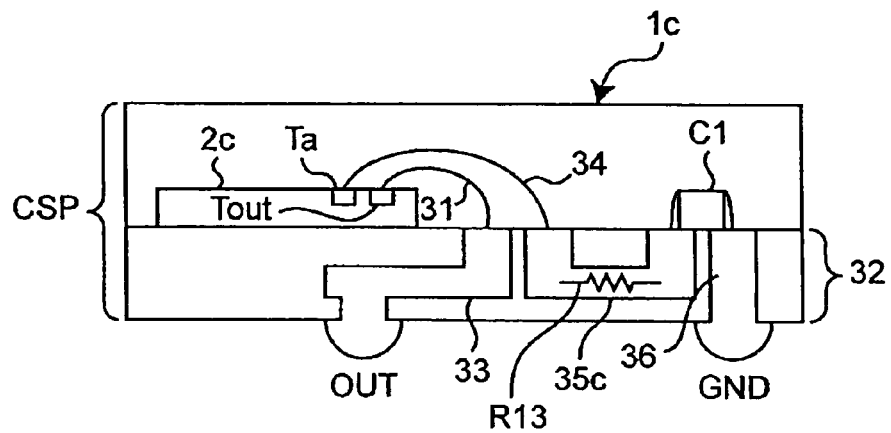
FIG. 9 is a schematic cross-sectional diagram illustrating a modification of the semiconductor device of the present invention.

FIG. 9 is a schematic cross-sectional diagram illustrating a modification of the semiconductor device of the present invention.

As shown in FIG. 9, the resistor R13 is formed to serve as the rerouting wire 35c of the interposer 32. Note that the bonding wire 34c in FIG. 8 is denoted to be a bonding wire 34 in FIG. 9, and the rerouting wire 35 in FIG. 8 is denoted to be a rerouting wire 35c in FIG. 9.

In addition, in the second and fourth embodiments, the resistor R13 may be formed by utilizing the chip resistance. In this case, similar to the output condenser C1, a so-called 1005 type resistor can be used as the resistor R13, which has a length less than or equal to 1 mm and a width less than or equal to 0.5 mm. Furthermore, the resistor R13 may be even smaller.

In addition, in the previous embodiments, it is described that the terminals of the semiconductor chip are connected to the rerouting wires of the interposer through the bonding wires. But this is just an example, and the present invention is not limited to this. For example, the terminals of the semiconductor chip may be connected to the rerouting wires of the interposer directly.

Figure 10A:
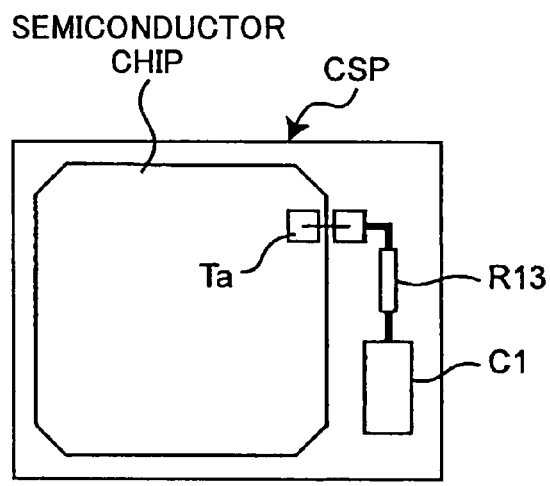
FIG. 10A and FIG. 10B are a plan view and a cross-sectional diagram, respectively, schematically illustrating another modification of the semiconductor device of the present invention.
Figure 10B:
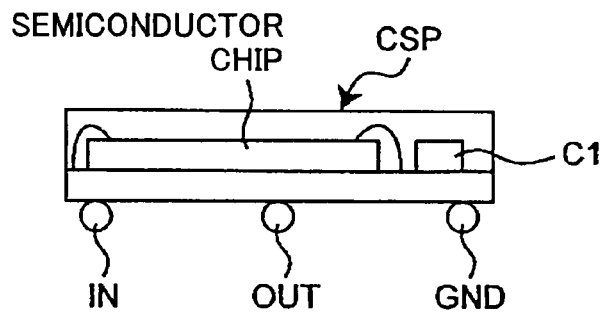
Figure 11:
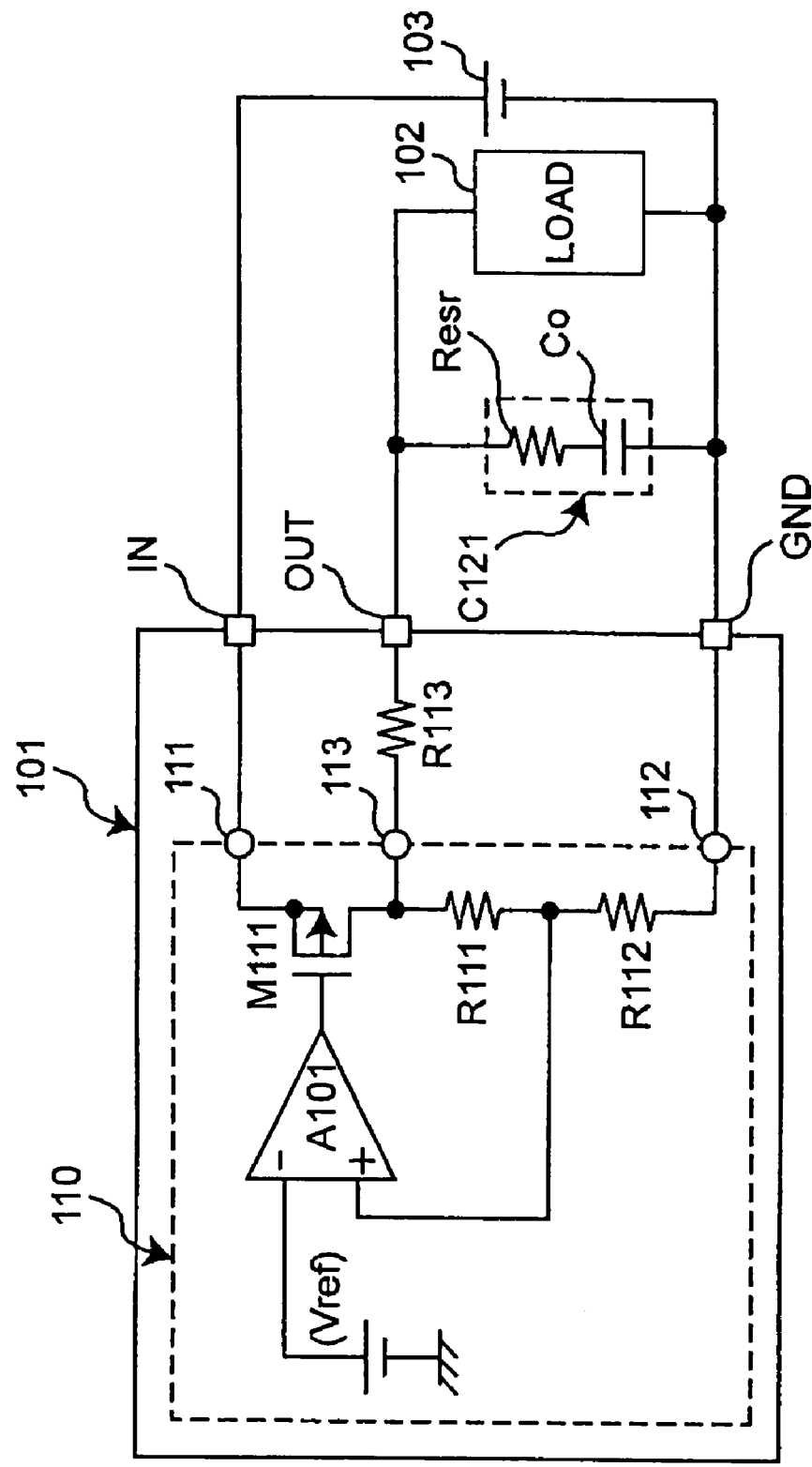
FIG. 11 is a circuit diagram illustrating an example of a semiconductor device of the related art, in which an IC chip having a voltage regulator is installed in a chip-size package (CSP).

FIG. 10A and FIG. 10B are a plan view and a cross-sectional diagram, respectively, schematically illustrating another modification of the semiconductor device of the present invention.

As shown in FIG. 10A and FIG. 10B, the wire connecting the connection terminal Ta of the semiconductor chip and the output condenser C1 may have cutout portions, and resistors may be formed at these cutout portions.

This patent application is based on Japanese Priority Patent Application No. 2005-280226 filed on Sep. 27, 2005, the entire contents of which are hereby incorporated by reference.

The invention claimed is:

1. A semiconductor device arranged as a single device package comprising:
    a semiconductor chip that includes a voltage regulator, a power supply input terminal, a ground terminal, and an output terminal through which a produced constant voltage output by the voltage regulator is supplied;
    a phase compensation condenser that is connected between the output terminal of the semiconductor chip and the ground terminal of the semiconductor chip, for phase compensation of the voltage regulator; and
    an interposer including (i) a first rerouting wire connecting an output terminal of the device package and the output terminal of the semiconductor chip via a bonding wire, and connecting one end of the phase compensation condenser and the output terminal of the device package, and (ii) a second rerouting wire connecting another end of the phase compensation condenser and a ground terminal of the semiconductor device package,
    wherein said one end of the phase compensation condenser receives the produced constant voltage output by the voltage regulator through the first rerouting wire, and said another end of the phase compensation condenser is connected through the second rerouting wire to the ground terminal, and
    wherein the interposer, the semiconductor chip and the phase compensation condenser as a whole are accommodated in the same single device package to increase phase margin and stability of the voltage regulator output through the output terminal of the device package.

2. The semiconductor device as claimed in claim 1, wherein the phase compensation condenser is connected to the semiconductor chip by using a rerouting wire of an interposer.

3. The semiconductor device as claimed in claim 1, wherein the phase compensation condenser has a length less than or equal to 1 mm and a width less than or equal to 0.5 mm.

4. The semiconductor device as claimed in claim 1, wherein the phase compensation condenser is a ceramic condenser.

5. The semiconductor device as claimed in claim 1, wherein the phase compensation condenser has an equivalent serial resistance from 10 mΩ to 500 mΩ.

6. A semiconductor device arranged as a single device package, comprising:
    a semiconductor chip that includes a voltage regulator, a power supply input terminal, a ground terminal, and an output terminal through which a produced constant voltage output by the voltage regulator is supplied;
    a serial circuit that is connected between the output terminal of the semiconductor chip and the ground terminal of the semiconductor chip and includes a phase compensation condenser for phase compensation of the voltage regulator and a phase compensation resistor for adjusting a resistance value of an equivalent serial resistance of the phase compensation condenser; and
    an interposer including a rerouting wire having (i) one end connected to the phase compensation condenser and (ii) another end connected to an output terminal of the semiconductor device package, wherein
    the interposer, the semiconductor chip, the phase compensation condenser and the serial circuit as a whole are accommodated in the same single device package to increase phase margin and stability of the voltage regulator output through the output terminal of the device package, and
    the phase compensation resistor is formed from a wiring resistance of said rerouting wire.

7. The semiconductor device as claimed in claim 6, wherein the phase compensation resistor has a length less than or equal to 1 mm and a width less than or equal to 0.5 mm.

8. The semiconductor device as claimed in claim 6, wherein the phase compensation resistor has a resistance from 10 mΩ to 15Ω.

9. A semiconductor device arranged as a single device package, comprising:
- a semiconductor chip that includes a voltage regulator, a power supply input terminal, a ground terminal, an output terminal through which a produced constant voltage output by the voltage regulator is supplied, and a connection terminal;
- a phase compensation condenser that is connected to the connection terminal of the semiconductor chip and that is connected between the connection terminal of the semiconductor chip and the ground terminal, for phase compensation of the voltage regulator; and
- an interposer including (i) a first rerouting wire connecting an output terminal of the device package and the output terminal of the semiconductor chip via a bonding wire, and (ii) a second rerouting wire connecting the connection terminal of the semiconductor chip and the phase compensation condenser, wherein
- the interposer, the semiconductor chip and the phase compensation condenser as a whole are accommodated in the same single device package to increase phase margin and stability of the voltage regulator output through the output terminal of the device package, and
- the semiconductor chip includes a phase compensation resistor that is connected between the connection terminal and the output terminal for adjusting a resistance value of an equivalent serial resistance of the phase compensation condenser.

10. A semiconductor device, comprising:
- a semiconductor chip that includes a voltage regulator, a power supply input terminal, a ground terminal, an output terminal through which a produced constant voltage output by the voltage regulator is supplied, and a connection terminal connected to the output terminal in parallel;
- a serial circuit that is connected between the connection terminal of the semiconductor chip and the ground terminal and includes a phase compensation condenser for phase compensation of the voltage regulator and a phase compensation resistor for adjusting a resistance value of an equivalent serial resistance of the phase compensation condenser,
- wherein the phase compensation resistor has one end connected to the connection terminal of the semiconductor chip and has another end connected to the phase compensation condenser, and
- wherein the semiconductor chip and the serial circuit as a whole are accommodated in a single package.

* * * * *

UNITED STATES PATENT AND TRADEMARK OFFICE
CERTIFICATE OF CORRECTION

| | | |
|---|---|---|
| PATENT NO. | : 7,989,935 B2 | Page 1 of 1 |
| APPLICATION NO. | : 11/791683 | |
| DATED | : August 2, 2011 | |
| INVENTOR(S) | : Kohzoh Itoh | |

It is certified that error appears in the above-identified patent and that said Letters Patent is hereby corrected as shown below:

Title Page

Replace the PCT Number section on the cover page of the patent, with the following:

-- (86)   PCT No.: PCT/JP2006/318434 --

Signed and Sealed this
Eighth Day of November, 2011

David J. Kappos
*Director of the United States Patent and Trademark Office*